United States Patent
Shiue et al.

(10) Patent No.: US 8,659,340 B2
(45) Date of Patent: Feb. 25, 2014

(54) TUNABLE VOLTAGE-CONTROLLED PSEUDO-RESISTOR

(75) Inventors: Muh-Tian Shiue, Hsinchu (TW); Kai-Wen Yao, Hengchung Township, Pingtung County (TW); Cihun-Siyong Gong, Kaohsiung (TW)

(73) Assignee: National Central University, Jhongli, Taoyuan County (TW)

( * ) Notice: Subject to any disclaimer, the term of this patent is extended or adjusted under 35 U.S.C. 154(b) by 0 days.

(21) Appl. No.: 13/421,376

(22) Filed: Mar. 15, 2012

(65) Prior Publication Data

US 2013/0069716 A1 Mar. 21, 2013

(30) Foreign Application Priority Data

Sep. 16, 2011 (TW) .............................. 100133336 A

(51) Int. Cl.
*H03L 5/00* (2006.01)
(52) U.S. Cl.
USPC ......................................... 327/308; 333/81 R
(58) Field of Classification Search
USPC .................. 327/306, 308, 581; 333/81 R
See application file for complete search history.

(56) References Cited

U.S. PATENT DOCUMENTS

| | | | |
|---|---|---|---|
| 7,298,010 B1 * | 11/2007 | Ma ................................. | 257/359 |
| 7,920,005 B2 * | 4/2011 | Yazicioglu et al. ........... | 327/276 |
| 8,072,269 B2 * | 12/2011 | Wu et al. ........................ | 330/253 |
| 8,305,140 B1 * | 11/2012 | Chen et al. ...................... | 330/85 |
| 8,344,810 B2 * | 1/2013 | Lian et al. ...................... | 330/305 |

OTHER PUBLICATIONS

Xiaodan Zou et al., "A 1-V 450-nW Fully Integrated Programmable Biomedical Sensor Interface Chip" *IEEE Journal of Solid-State Circuits*, vol. 44, No. 4, Apr. 2009 pp. 1067-1077.
A. Tajalli et al., "Implementing ultra-high-value floating tunable CMOS resistors" *Electronics Letters*, Feb. 28, 2008, vol. 44, No. 5, (2) pages.
Roy H. Olsson, III et al., "Band-Tunable and Multiplexed Integrated Circuits for Simultaneous Recording and Stimulation With Microelectrode Arrays" *IEEE Transactions on Biomedical Engineering*, vol. 52, No. 7, Jul. 2005, pp. 1303-1311.
Reid R. Harrison et al., "A Low-Power Low-Noise CMOS Amplifier for Neural Recording Applications" *IEEE Journal of Solid-State Circuits*, vol. 38, No. 6, Jun. 2003, pp. 958-965.
M.-T. Shiue et al., "Tunable high resistance voltage-controlled pseudo-resistor with wide input voltage swing capability" *Electronics Letters*, Mar. 17, 2011, vol. 47, No. 6, (2) pages.

* cited by examiner

*Primary Examiner* — Dinh T. Le
(74) *Attorney, Agent, or Firm* — Muncy, Geissler, Olds & Lowe P.C.

(57) ABSTRACT

A tunable voltage-controlled pseudo-resistor structure, comprising: a symmetric PMOS transistor circuit and an auto-tuning circuit connected in series. Input of the auto-tuning circuit is connected to a central position $V_f$ of the PMOS transistor circuit having its output $V_g$, with its purpose of keeping $V_g-V_f$ at a constant value. The PMOS transistor circuit may produce body effect through various different bulk voltages. Through the auto-tuning circuit, $V_g$ and $V_f$ are kept constant to make current of transistor to produce compensation effect, such that regardless of $V_a>V_b$ or $V_a<V_b$, a large resistance is maintained. Through utilizing the tunable voltage-controlled pseudo-resistor structure, constant resistance can be maintained under high input voltage, hereby reducing drifting of common-mode voltage, in achieving a superior resistance effect.

6 Claims, 12 Drawing Sheets

TUNABLE VOLTAGE-CONTROLLED PSEUDO-RESISTOR

BACKGROUND OF THE INVENTION

1. Field of the Invention

The present invention relates to a tunable voltage-controlled pseudo-resistor, and in particular to a tunable voltage-controlled pseudo-resistor, that is composed mainly of series-connected PMOS elements operated in sub-threshold regions in cooperation with an auto-tuning circuit, so that the pseudo-resistor is able to overcome the variations of manufacturing process and drift of common-mode voltage, in achieving symmetric voltage-resistance characteristics, while maintaining constant resistance under high input voltage.

2. The Prior Arts

In general, the active type resistor used for testing in CMOS manufacturing process is operated in a triode region, with its aim of providing a resistance as small as possible, so that the switching circuit can be designed to lower its resistance and noise. Usually, in an analog front-end circuit for biomedical or audio application, a very large resistance is required to achieve an ultra-low frequency pole, to filter out the noise outside the operation frequency. However, regardless of using off-the-shelf devices, or standard cells on chips, this approach of providing high resistance is not very cost effective. The design of placing passive elements on chip is a feasible solution, but it occupies quite a large area. In addition, to connect MOS transistors of long length in series is able to achieve high resistance, yet that still has to occupy quite a large area and instability in process variations, if the ultra-low frequency is required.

In reference document 1, a pseudo-resistor is realized through connecting diodes. Though this approach can realize high resistance required, yet it has the unsymmetric voltage-resistance characteristics (for example, when input voltage level >0, and the signal swing is low, the equivalent resistance is quite large; and when voltage level <0, it means that the reverse current flow is occurred, and the equivalent resistance is reduced drastically), and when it is subjected to DC drifting of common-mode voltage (DC voltage or voltage across two ends of a resistor), the resistance obtained is reduced significantly.

In reference document 2, it is pointed that, in case high voltage is applied on gate of a transistor, the transistor can provide fairly high resistance, but since its resistance can not be adjusted, its application is rather limited.

In reference documents 3 and 4, it is further pointed out that, if the voltage applied on a gate of a transistor, and voltages in-between the series-connected transistors are kept constant, the pseudo-resistor circuit can provide symmetric voltage-resistance characteristic (namely, when voltage >0 or voltage <0, current can flow from left to right, or current can flow from right to left, such that high resistance can be obtained). In other words, this kind of design can overcome the drift of common-mode voltage, but it still affected by the limitations that range of input voltage is not wide enough.

In particular, for reference document 3, in case the circuit controlling the gate voltage of the transistor is designed to be a source follower circuit, then the variations of voltage across two ends of the pseudo-resistor (namely, the drifting of the common-mode voltage) can not be linearly (singly) detected and followed due to the limited linear operation of the source follower circuit, so that in an analog front-end circuit of biomedical application, a stable cutoff frequency can not be obtained in large input swing. The shortcomings of reference documents 3 and 4 are that, the range of input voltage is rather small, and an external control circuit is required.

In view of the problems and shortcomings of the prior art, the design and development of a pseudo-resistor capable of providing stable and extra-high resistance while increasing input voltage range, is an urgent task in this field.

REFERENCE DOCUMENTS (1) R. R. Harrison and C. Charles, "A low-power low-noise CMOS amplifier for neural recording applications", IEEE J. Solid-State Circuits, vol. 38, no. 6, pp. 958-965, June 2003.

(2) R. H. Olssen, III, D. L. Buhl, A. M. Sirota, G. Buzsaki, and K. D. Wise, "Band-tunable and multiplexed integrated circuits for simultaneous recording and stimulation with microelectrode arrays', IEEE Trans. Biomed. Eng., vol. 52, pp. 1303-1310, July 2005.

(3) A Tajalli, Y. Leblebici, and E. J. Brauer, "Implementing ultra-high-value floating tunable CMOS resistors', IEE Electron, Lett., vol. 44, no. 5, pp. 349-350, February 2008.

(4) X. Zou, X. Xu, L. Yao, and Y. Lian, "A 1-V450-nW Fully Integrated Programmable Biomedical Sensor Interface Chip", IEEE J. Solid-State Circuits, vol. 44, no. 4, pp. 1067-1077, April 2009.

SUMMARY OF THE INVENTION

An objective of the present invention is to solve the problem of the prior art that, conventionally, in an analog front-end circuit for biomedical or audio applications, a fairly large resistance is required to realize a polar point (polar point of a filter) at very low frequency, to filter out noise outside the operation frequency. However, presently, regardless of using off-the-shelf devices or standard cells on a chip, it is rather not cost effective to realize such a high resistance. To place passive elements on a chip is a way of solution, but this will occupy a quite a large area. In addition, high resistance can also be achieved through series-connecting MOS transistors of long length, but that also requires a large area and instability in process variations.

In order to solve the problem of the prior art, the present invention provides a tunable voltage-controlled pseudo-resistor structure, comprising a symmetric PMOS transistor circuit and an auto-tuning circuit connected in series. The input of the auto-tuning circuit is connected to the central position $V_f$ of the PMOS transistor circuit with its output $V_g$. The purpose of this design is to keep $V_g-V_f$ at a constant value, so that the PMOS transistor circuit may produce Body Effect through various different bulk voltages. Through this auto-tuning circuit, $V_g$ and $V_f$ are kept constant to make currents of transistors to produce compensation effect, so regardless of $V_a>V_b$ or $V_a<V_b$, a large resistance can be maintained.

In one aspect of the present invention, the auto-tuning circuit is composed of an amplifier, four sets of active type resistors and capacitors, connected in parallel.

In another aspect of the present invention, the auto-tuning circuit can be operated in cooperation with an external control terminal $V_{ctrl}$ to adjust the difference of $V_g-V_f$.

Compared with the prior art, the present invention provides a tunable voltage-controlled pseudo-resistor structure, having the following advantages:
1. having high and tunable resistance;
2. $V_{ab}$ DC drift rejection; and
3. enlarged range of input voltage.

The pseudo-resistor of the present invention is provided with the symmetric voltage-resistance characteristics, capable of maintaining constant resistance under high input voltage, and is suitable for use in applications requiring very low cut-off frequency. As such, it can not only be utilized in audio, analog, and biomedical applications, but it can also have wide range of input voltage, hereby providing tunable resistance and achieving reduction of cost and power consumption.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed descriptions with reference to the attached drawings.

Figure 1:
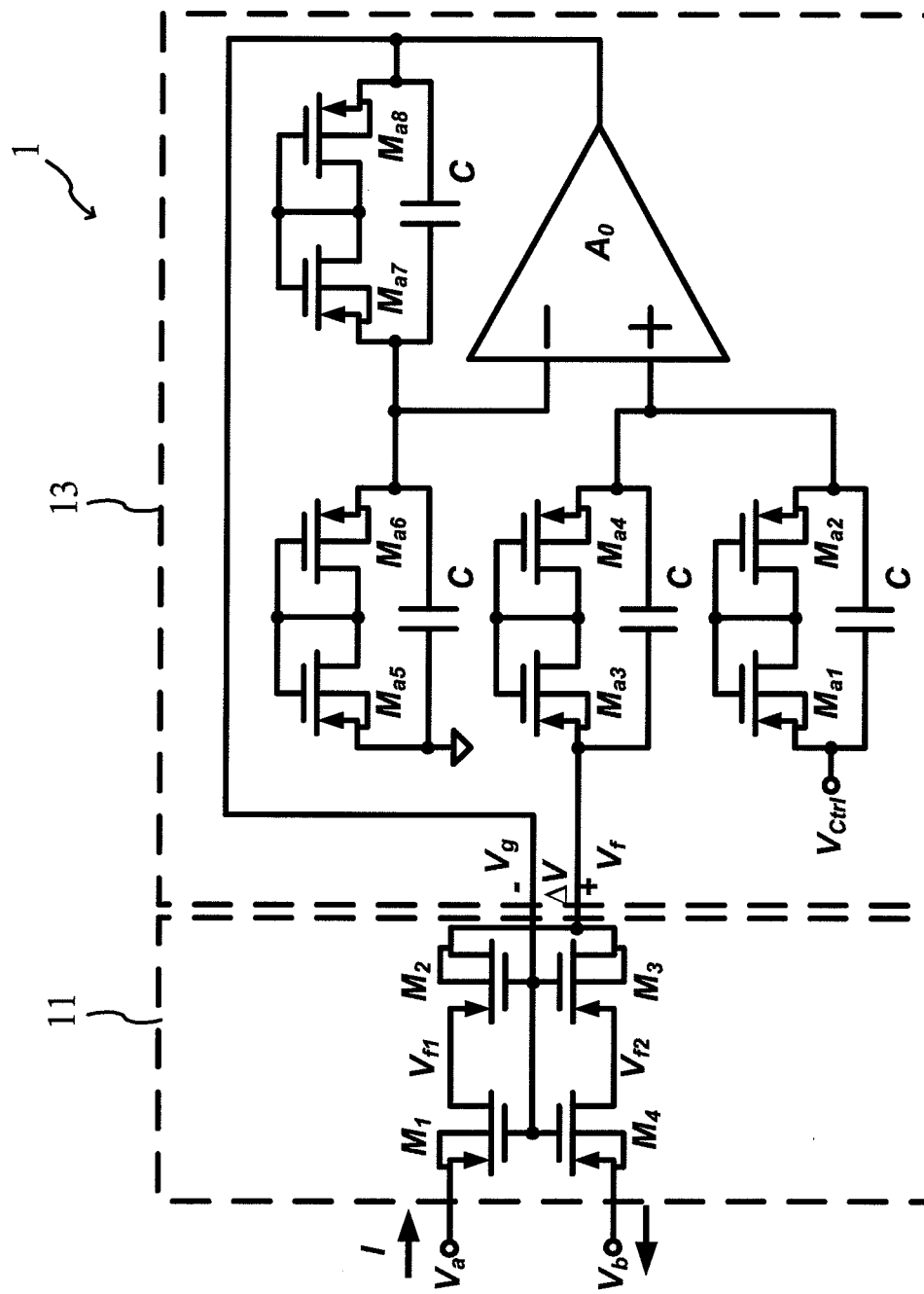
FIG. 1 is a circuit diagram of a tunable voltage-controlled pseudo-resistor structure according to the present invention.
Figure 1A:
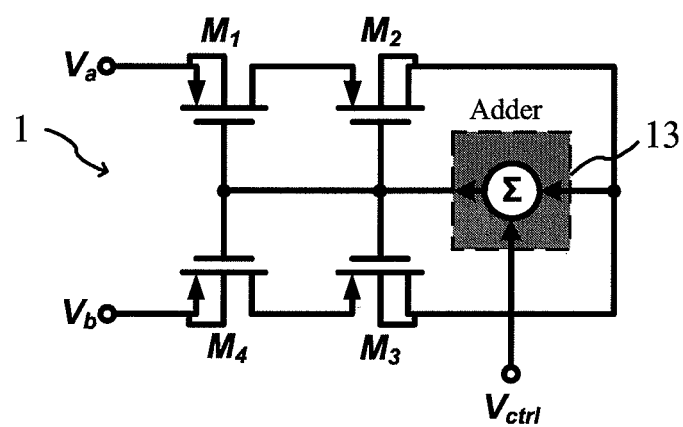
FIG. 1(A) is a circuit diagram of another tunable voltage-controlled pseudo-resistor structure according to the present invention.

Refer to FIG. 1 and FIG. 1(A) for a circuit diagram of a tunable voltage-controlled pseudo-resistor structure according to the present invention. As shown in FIGS. 1 and 1(A), the tunable voltage-controlled pseudo-resistor structure 1 includes a symmetric PMOS transistor circuit (11) and an auto-tuning circuit (13) connected in series. The PMOS transistor circuit is formed by four PMOS elements ($M_1$,$M_2$,$M_3$, $M_4$) connected in series; while the auto-tuning circuit is an analog adder formed by an amplifier and four sets of active type resistors ($M_{a1}$~$M_{a8}$) and capacitors connected in parallel. In addition, the input terminal of the auto-tuning circuit is at a central position $V_f$ of the PMOS transistor circuit having output $V_g$. Its purpose is to keep $V_g$-$V_f$ at constant value, to change the difference of $V_g$-$V_f$ in cooperation with an external control terminal ($V_{ctrl}$). The PMOS transistor circuit utilizes different bulk voltages in each transistor element, to produce different threshold voltage, which keeps the voltages $V_g$ and $V_f$ constant through the auto-tuning circuit, so that currents flowing through the transistors will produce mutual compensation. Therefore, regardless that $V_a$>$V_b$ or $V_b$>$V_a$, one end of the proposed PMOS transistor circuit can maintain a high resistance.

Figure 1B:
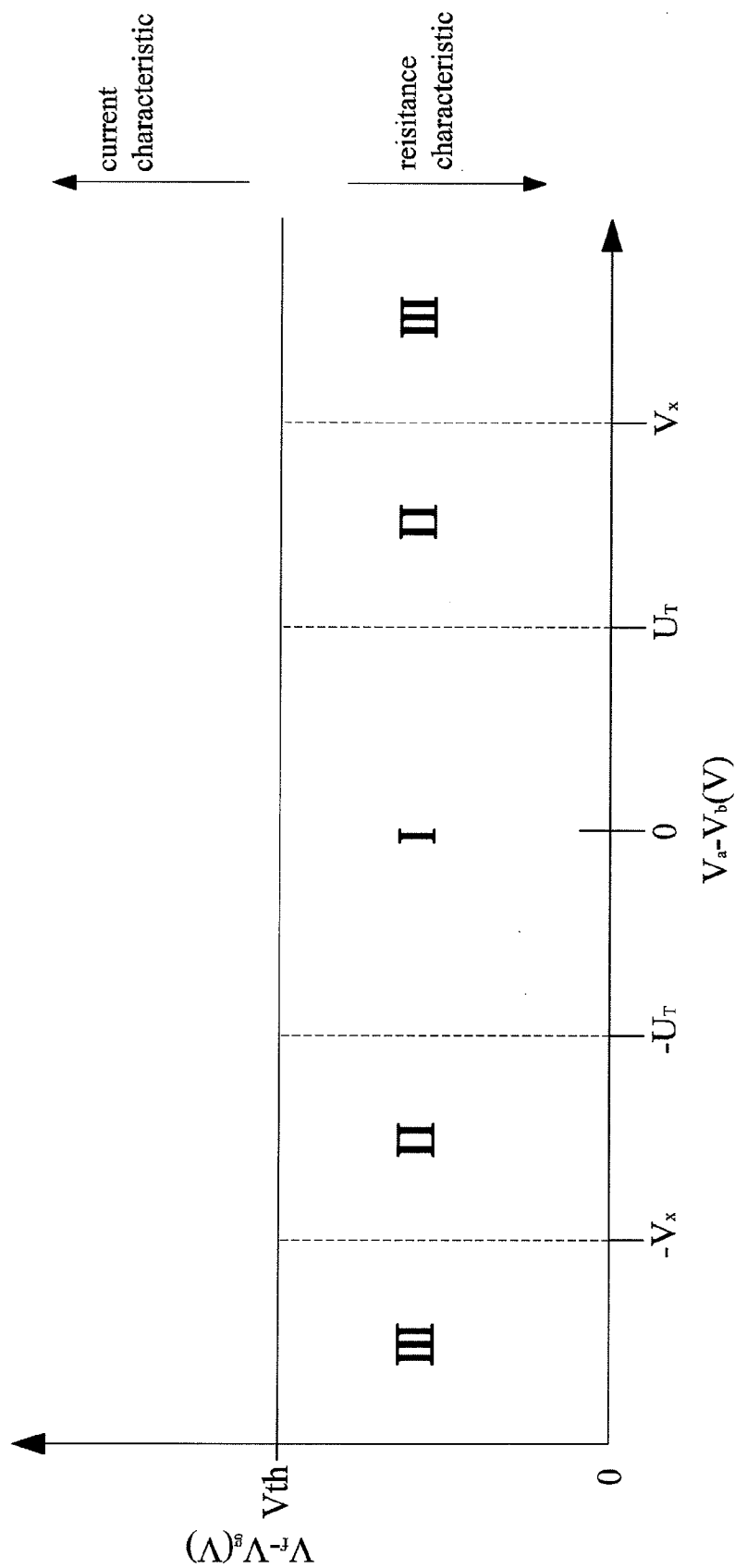
FIG. 1(B) is a diagram showing electrical characteristics of PMOS elements $M_1$-$M_4$ under different voltages.

As such, the present invention provides a high resistance tunable voltage-controlled pseudo-resistor structure capable of maintaining high resistance under high cross-over voltage, that can be used in biomedical circuit, and it can also be used in an ordinary analog circuit. Furthermore, the symmetric voltage-resistance characteristic of the pseudo-resistor is capable of overcoming drifting of common-mode voltage. In the following, refer to FIG. 1(B) for a diagram showing electrical characteristics of PMOS elements $M_1$~$M_4$ under different voltages (wherein, $V_j$ is the threshold voltage of a diode, and when the voltage is greater than $V_j$, that means the diode is conducted; UT=thermal voltage (0.026V); and $V_X$ is the voltage when leakage current occurs, not having a specific value), having the following conditions:

1. Above the horizontal line of $V_{th}$, the transistor falls into a saturation region or a triode region, having characteristic of current source and small linear resistance;

2 When $V_a$-$V_b$<|UT| and $V_f$-$V_g$<$V_{th}$, the transistor falls into the region I, $M_1$~$M_4$ are operated in the sub-threshold region, having the characteristic of high resistance of a large resistor, with the resistance value R_$M_1$+R_$M_2$+R_$M_3$+R_$M_4$.

3. When |UT|<$V_a$-$V_b$<|$V_X$| and $V_f$-$V_g$<$V_{th}$, the transistor falls into region II, $M_1$~$M_4$ are operated in the sub-threshold region, having the characteristic of high resistance of a large resistor. The resistance has the approximate effects: when $V_a$>$V_b$, R~R_$M_3$+R_$M_4$, and when $V_a$<$V_b$, R~R_$M_1$+R_$M_2$.

4. when |$V_X$|<$V_a$-$V_b$ when $V_f$-$V_g$<$V_{th}$, the transistor falls into region III, $M_1$~$M_4$ are operated in the sub-threshold region, having the characteristic of high resistance of a large resistor, and leakage current will occur. However, the resistance can overcome this problem. when $V_a$>$V_b$, and when ($V_{f2}$-$V_b$)>$V_j$, $M_4$ may produce parasitic BJT effect, to produce leakage current effect, this condition can be improved by adjusting ratios of $M_1$,$M_4$, and $M_2$,$M_3$; when $V_a$<$V_b$, and when ($V_{f1}$-$V_a$)>$V_j$, $M_1$ may produce parasitic BJT effect, to produce leakage current effect, this condition can be improved by adjusting ratios of $M_1$, $M_4$, and $M_2$, $M_3$.

Figure 2:
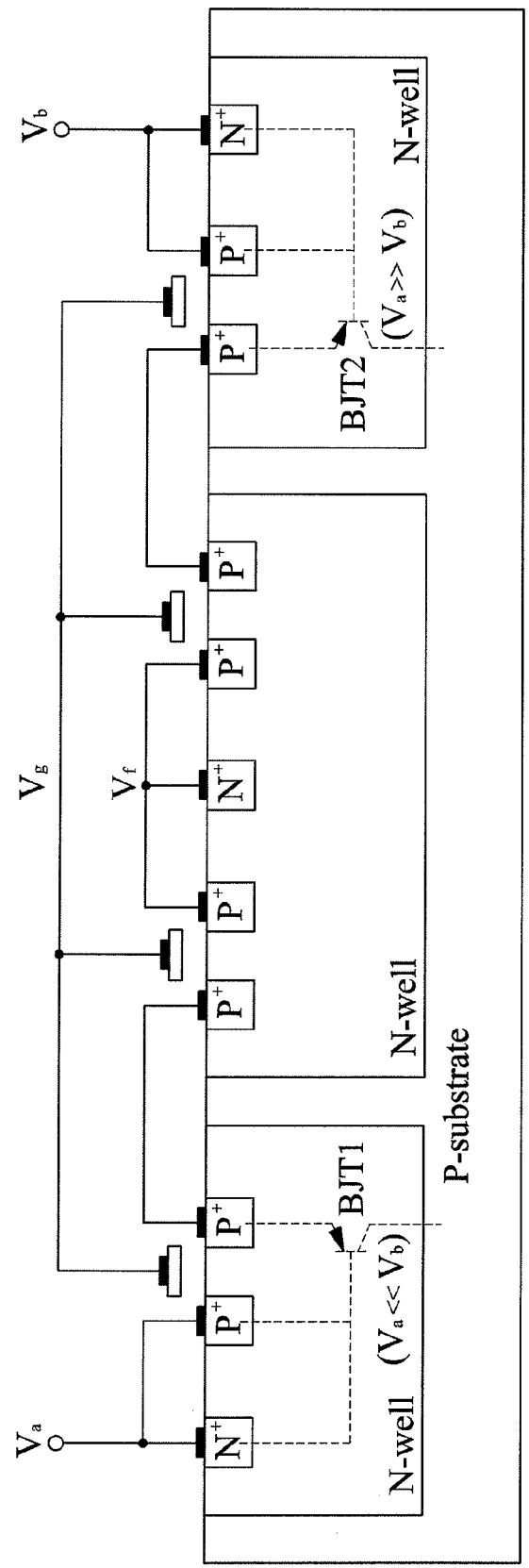
FIG. 2 is a cross section view of a tunable voltage-controlled pseudo-resistor structure according to the present invention.

Then, refer to FIG. 2 for a cross section view of a tunable voltage-controlled pseudo-resistor structure according to the present invention. As shown in FIG. 2, when $V_b$>>$V_a$, the parasitic BJT1 starts to work, thus leakage current will occur. On the contrary, when $V_a$>>$V_b$, the parasitic BJT2 starts to work, thus leakage current will occur. At this time, the symmetric PMOS transistor circuit can be provided with large resistance by the transistor at the other side, to prevent the reduction of resistance.

Figure 3A:
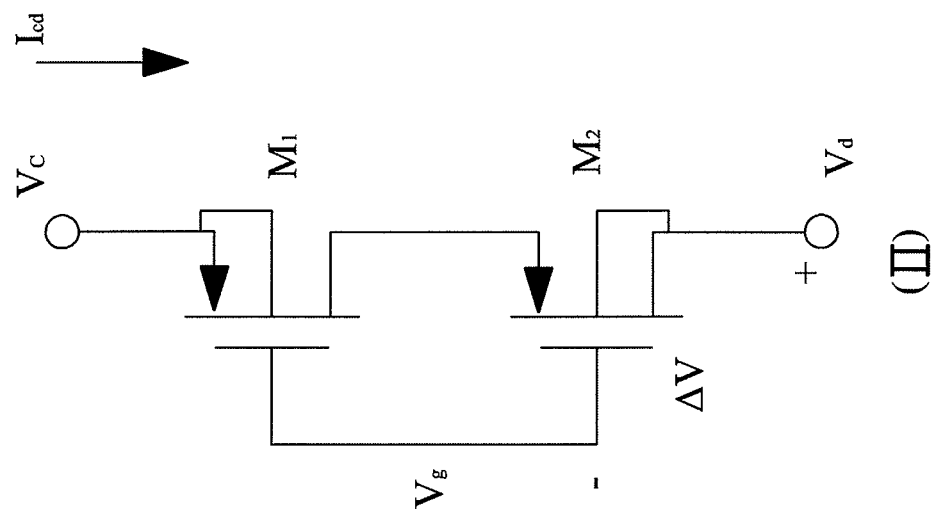
FIG. 3(A) is half circuit diagrams of the pseudo-resistor circuit according to the present invention.
Figure 3A:
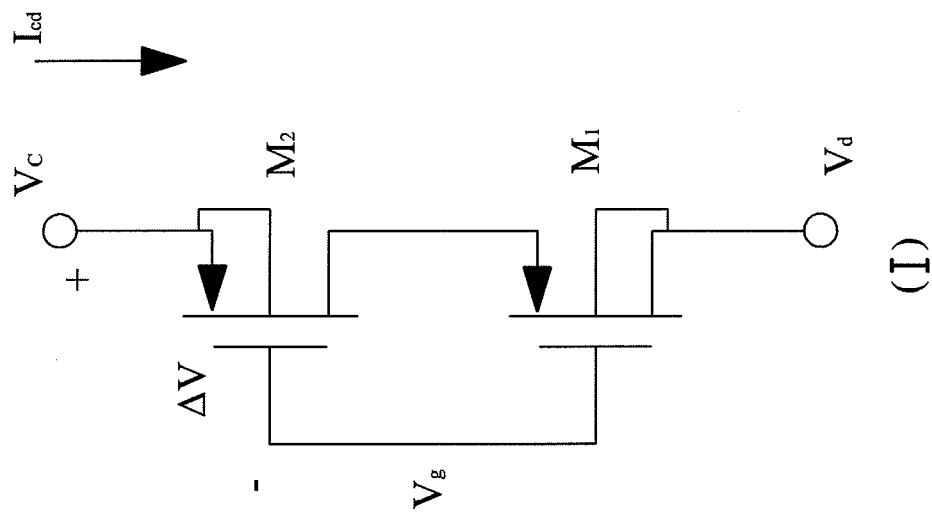
Figure 3B:
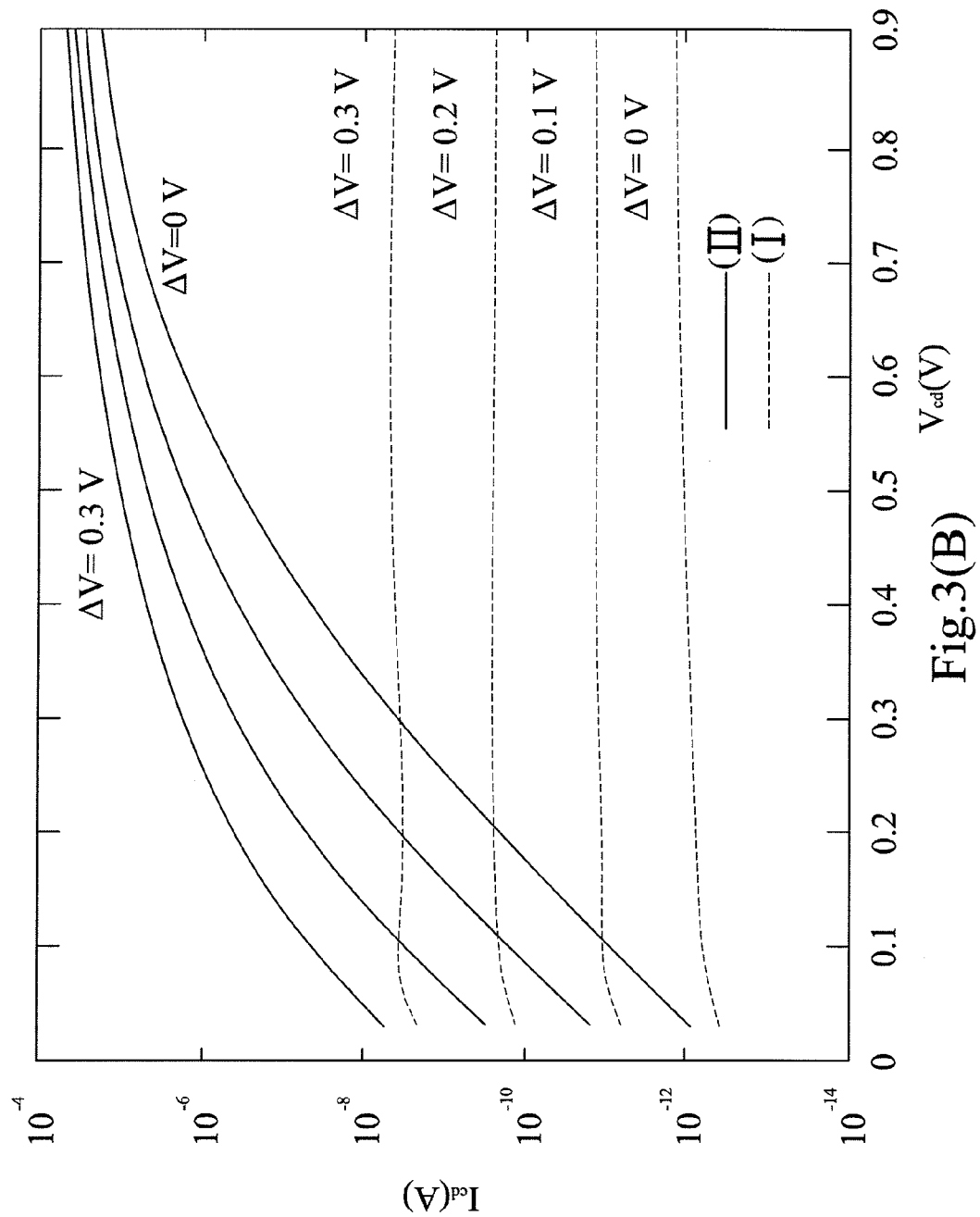
FIG. 3(B) is curve of current vs voltage simulation of the circuit shown in FIG. 3A.

Subsequently, refer to FIG. 3(A) for a half circuit diagrams of the pseudo-resistor circuit according to the present invention, which shows that how the four PMOS elements ($M_1$, $M_2$, $M_3$, $M_4$) determine the overall resistance required. Wherein, $\Delta V$ in FIG. 3(A) is $V_{f-g}$ in FIG. 1, and (I) is the structure of $M_3$ and $M_4$ in FIG. 1, then current flows from $V_f$ to $V_b$; and when (II) in FIG. 3(A) is the structure of $M_1$ and $M_2$ in FIG. 1, then current flows from $V_a$ to $V_f$. FIG. 3(B) shows the curve of current-to-voltage simulation of regions (I) and (II) in FIG. 3(A). From FIGS. 3(A) and (B), the operation characteristics of the tunable voltage-controlled pseudo-resistor can be explained, when $V_{ab}>0$. When $V_a>V_b$, the overall resistance R_total is approximately R_M$_3$+R_M$_4$ (since the resistance of M$_1$ and M$_2$ is too small, so they can be neglected). At this time, $V_{ab}$ is approximately $V_{fb}$. On the contrary, when $V_b>V_a$, the overall resistance R_total is approximately R_M$_1$+R_M$_2$ (since the resistance of M$_3$ and M$_4$ is too small, so they can be neglected). At this time, $V_{ba}$ is approximately $V_{fa}$. As such, through adjusting size of transistor to make M$_1$=M$_4$, and M$_2$=M$_3$, the overall resistance R_total can be kept near constant, regardless $V_a>V_b$ or $V_b>V_a$.

Figure 4A:
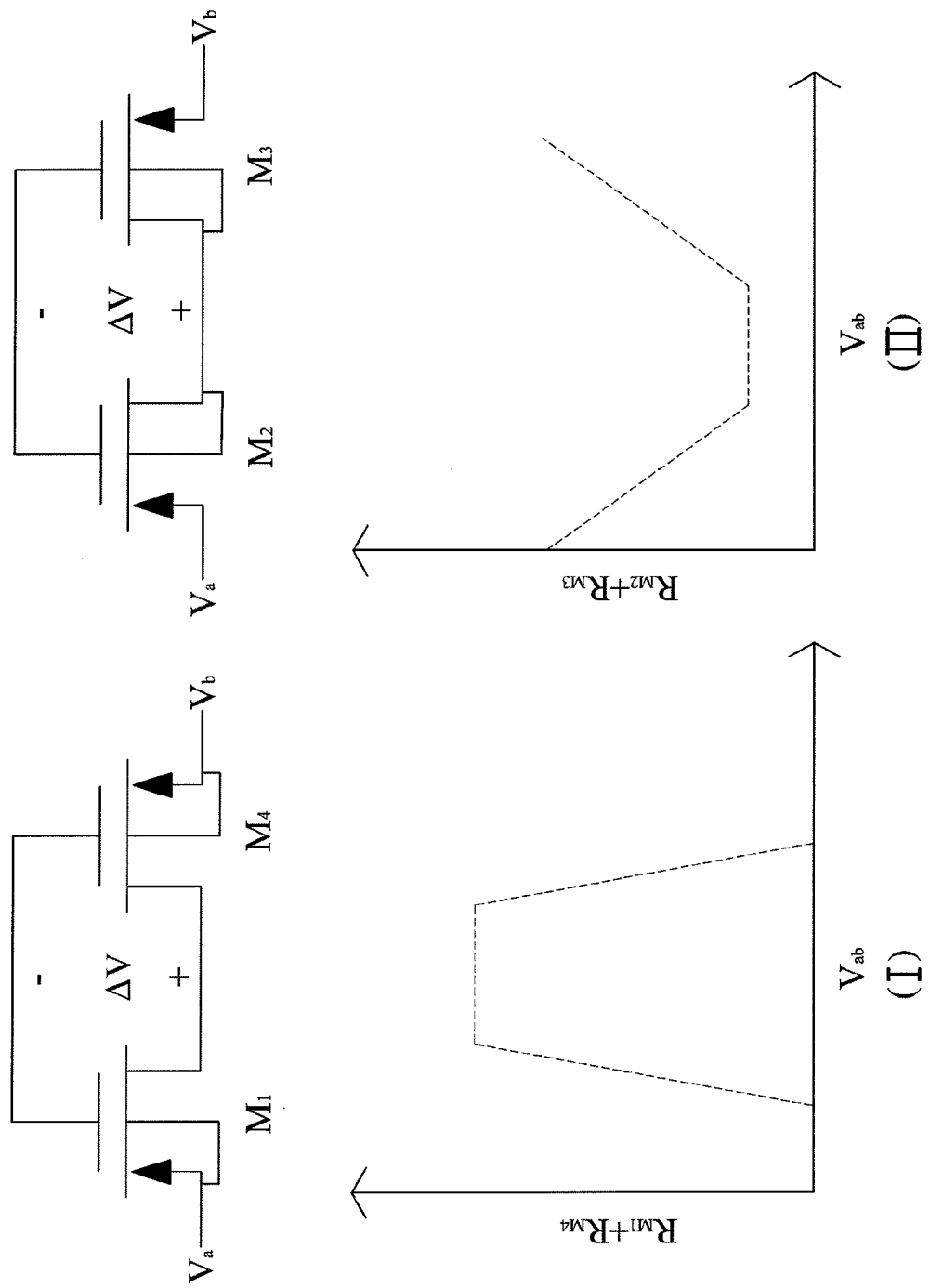
FIG. 4(A) is a diagram showing the mechanism of how $R_{tot}$ reaches a near constant resistance.
Figure 4B:
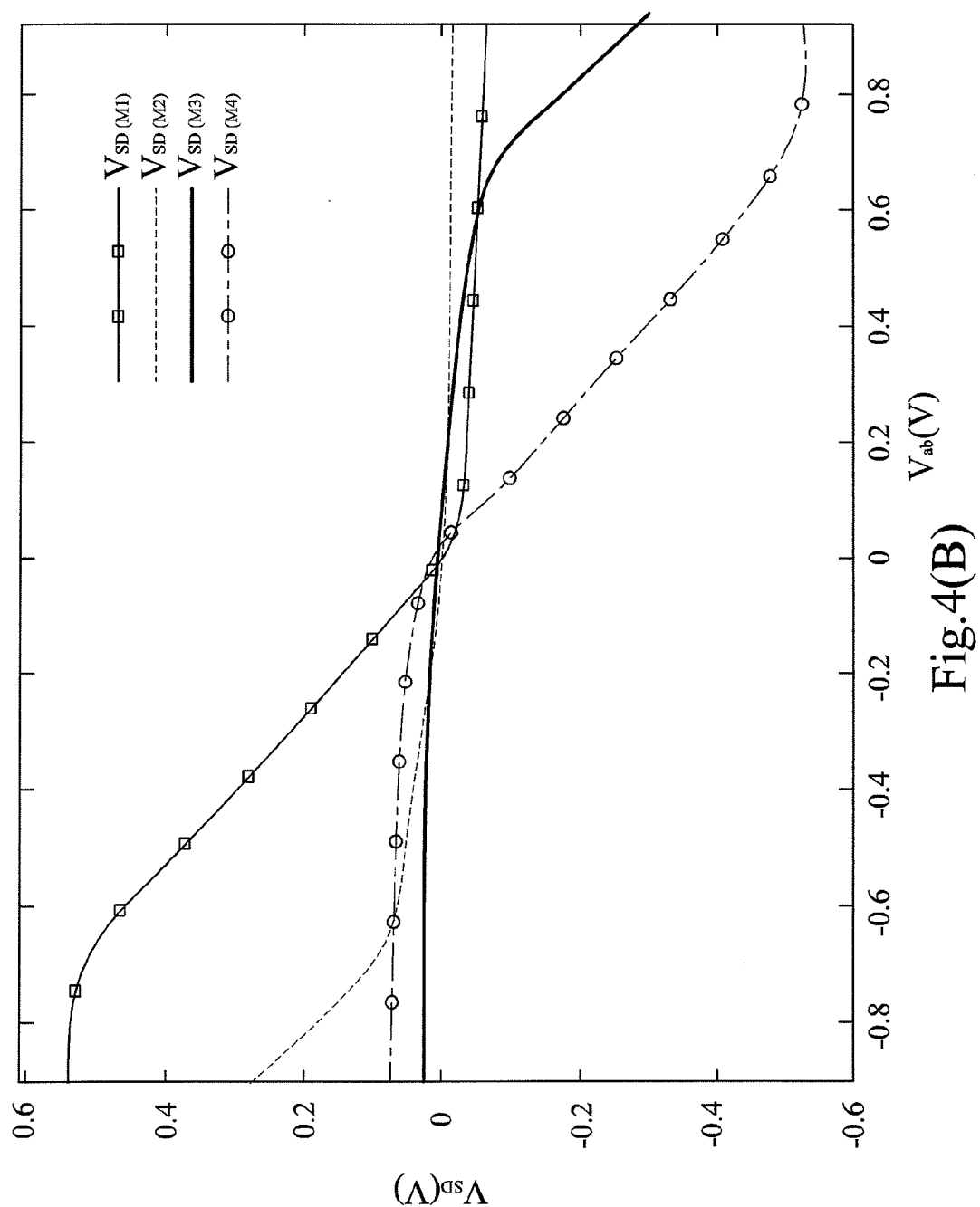
FIG. 4(B) is a diagram showing the relations between $V_{SD}$ and $V_{ab}$ according to the present invention.

Compared with reference documents 2 and 3 of the prior art, the marked characteristic of the present invention is the addition of M$_2$ and M$_3$. In case M$_2$ and M$_3$ are eliminated, and only M$_1$ and M$_4$ are left, then at this time, its characteristics are the same as shown in FIG. (I) of FIG. 4(A). Wherein, it shows that the resistance will drop at larger voltage difference. In order to compensate this non-ideal effect, the present invention provides M$_2$ and M$_3$ as shown in FIG. (II) of FIG. 4(A), with its characteristics compensating for that of FIG. (I) in FIG. 4(A), since it can provide higher resistance at larger voltage difference. The combination of M$_2$ and M$_3$ with M$_1$ and M$_4$ can extend the range of input voltage to obtain stable resistance. So, in the present invention, the simulation of FIG. 4(B) can be used to explain the circuit diagram of FIG. 4(A).

Since the circuit under consideration is symmetric in nature, therefore, the present invention only describe route of $V_{af}$, the response of the other side is symmetric, and it will not be repeated here for brevity. In this case, when $V_{ab}$ changes (the difference increases), suppose $\Delta V$ is fixed at 0.1V, then PN junction of source-body side in M$_1$ will conduct at $V_{ab}<-0.6V$, to produce leakage current and reduce its resistance. Fortunately, in this condition, due to the existence of the pseudo resistance, the total resistance of M$_1$ and M$_2$ is close to the resistance of M$_2$ (the resistance of M$_1$<<the resistance of M$_2$, so that the leakage current will not affect the overall resistance). In this respect, the increase of VSD2 can be used to verify the changes, and the total resistance R-total of the pseudo-resistor can be expressed in the following equation:

$$R_{tot}^{-1} = \sum_{n=1}^{4} G_{SDn}$$
$$= \frac{I_{SD}}{U_T} \cdot \left[ \frac{(n-1)e^{V_{SD1}/U_T}+1}{e^{V_{SD1}/U_T}-1} + \frac{N_r}{e^{V_{SD2}/U_T}-1} + \frac{N_r}{1-e^{-V_{SD3}/U_T}} + \frac{1-(1-n)e^{-V_{SD4}/U_T}}{1-e^{-V_{SD4}/U_T}} \right]$$

Wherein, $N_r$=(W/L)2,3/(W/L)1,4. $V_{Ctrl}$ are used to determine the magnitude of resistance, so programmable digital-to-analog converter is used to determine the magnitude of voltage value $V_{Ctrl}$.

Figure 5:
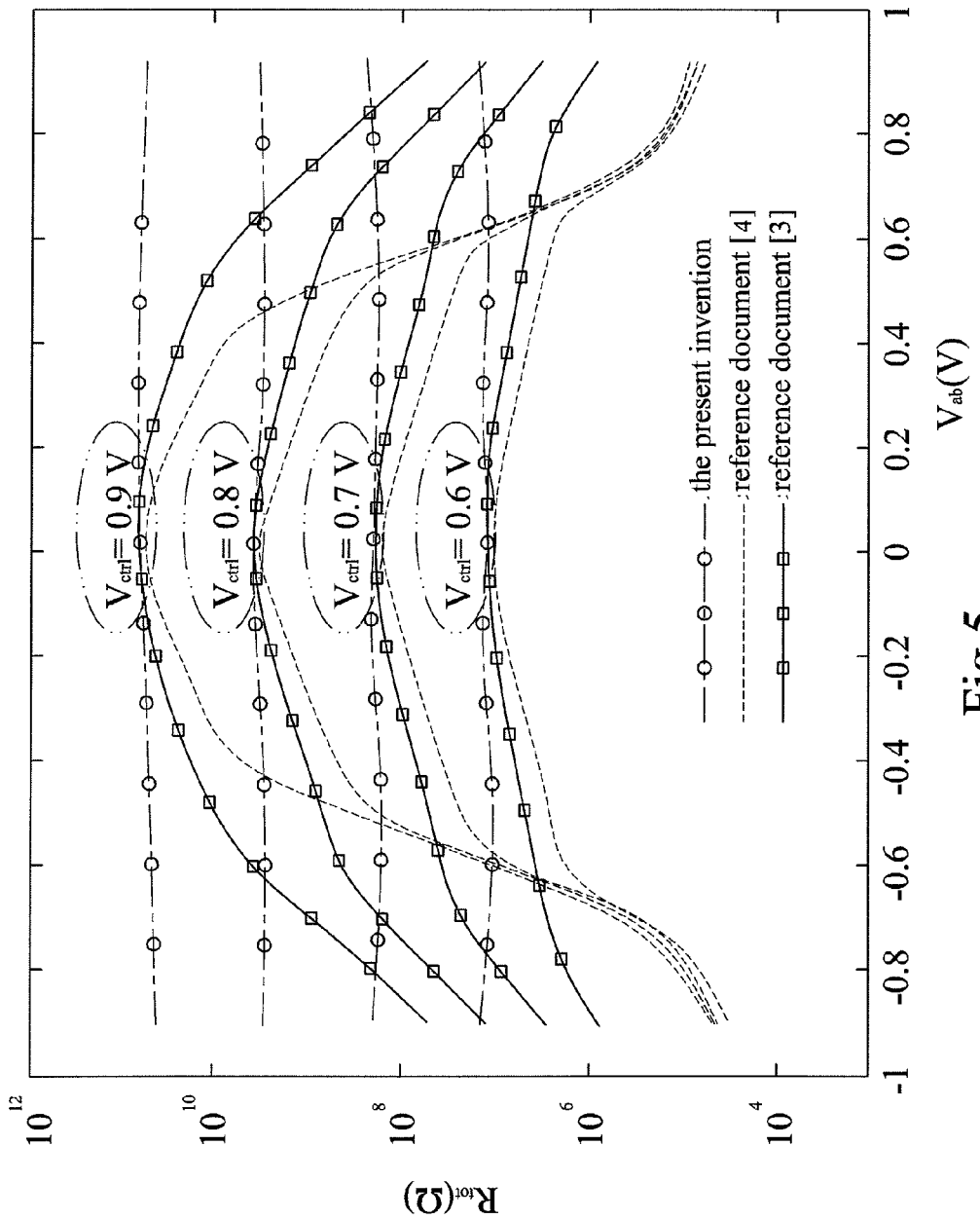
FIG. 5 is a diagram showing resistance vs voltage relations for the present invention, reference 4, and reference 3.

The performance of tunable voltage-controlled pseudo-resistor of the present invention can be verified through using a 0.18 μm standard CMOS manufacturing process. Wherein, the element parameters are (W/L)1.4=(1/0.18)μm, (W/L)2.3=(10/0.18)μm, (W/L)a1–8=(0.5/5)μm, and C=182 fF. The current supply of A$_0$ amplifier is 10.7 nA, with its unit gain bandwidth of 1.27 MHz. FIG. 5 is a comparison diagram of resistance vs voltage of the present invention and reference documents 4, and 3, wherein, $V_b$ is fixed at 0V, and when $V_a$ is scanned from –0.9V to 0.9V, and $V_{Ctrl}$ is adjusted, it can be found that the resistance can be adjusted from a range of MΩ to GΩ. In setting the simulation parameters, the transistor parameters of reference documents 4 and 3 is completely the same as that of (W/L)1.4. From FIG. 5, it is evident that, compared with reference documents 4, and 3, the pseudo-resistor of the present invention can have wider range of input voltage. Finally, the energy consumption of the overall operation at 1.8V is 19.28 nW.

The present invention provides a tunable voltage-controlled pseudo-resistor structure, capable of maintaining large resistance under high cross-over voltage. In addition to being used in biomedical amplifier, it can also be used in ordinary analog circuit, such as common-mode feedback circuit, analog filter. For an ordinary biomedical amplifier, DC level deviation would occur between the output terminal, the inverting input terminal, and the non-inverting input terminal, due to difference of manufacturing processes, temperature variations, and layout mismatch. Ideally, the DC levels of the output terminal, the inverting input terminal, and the non-inverting input terminal should be the same, when the deviation is overly large, thus leading to signal distortion, also since its cut-off frequency can not be changed, so it can only have a single application.

Figure 6:
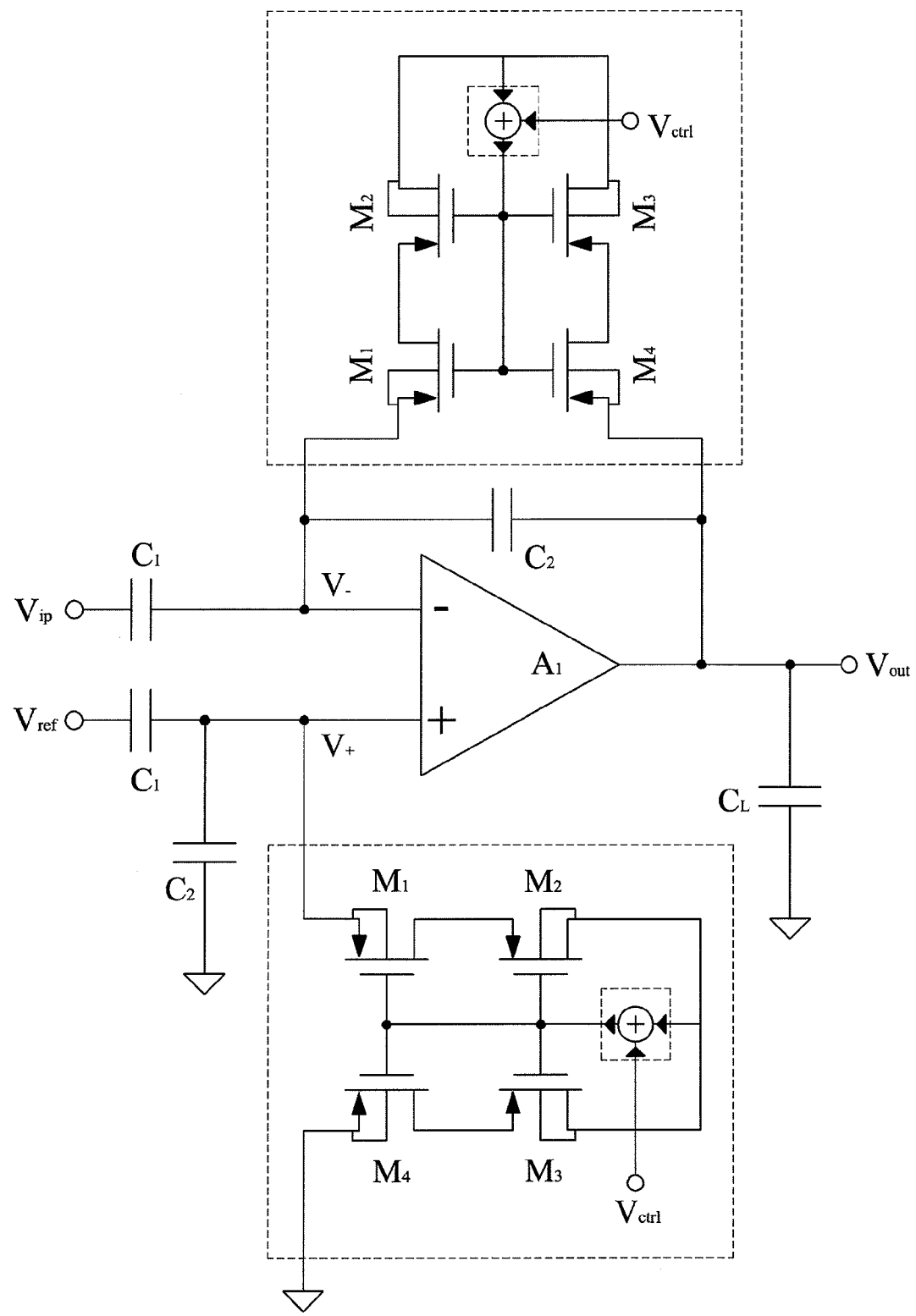
FIG. 6 is a circuit diagram showing applying the tunable voltage-controlled pseudo-resistor structure to a biomedical signal amplifier according to the present invention.

In this respect, refer to FIG. 6 for a circuit diagram showing application of the tunable voltage-controlled pseudo-resistor structure in a biomedical signal amplifier according to the present invention, and that is realized through substituting the tunable voltage-controlled pseudo-resistor structure 1 of FIG. 1 for the pseudo-resistor in reference document 1. In the present invention, due to the wide range of input voltage, the risk of distortion is reduced, thus it is capable of improving the resistance reduction caused by non-ideal effect due to variations of manufacturing processes, and providing selections of resistances. Or, alternatively, the tunable voltage-controlled pseudo-resistor structure 1 can be used to substitute the pseudo-resistor in reference document 2, to provide selection of resistances, adjustment of the resistance, and change of cut-off frequency. Moreover, the tunable voltage-controlled pseudo-resistor structure 1 can be used to substitute the pseudo-resistors in reference documents 3, and 4, to maintain large resistance when the voltage difference between two sides of the resistor is overly large.

Figure 7:
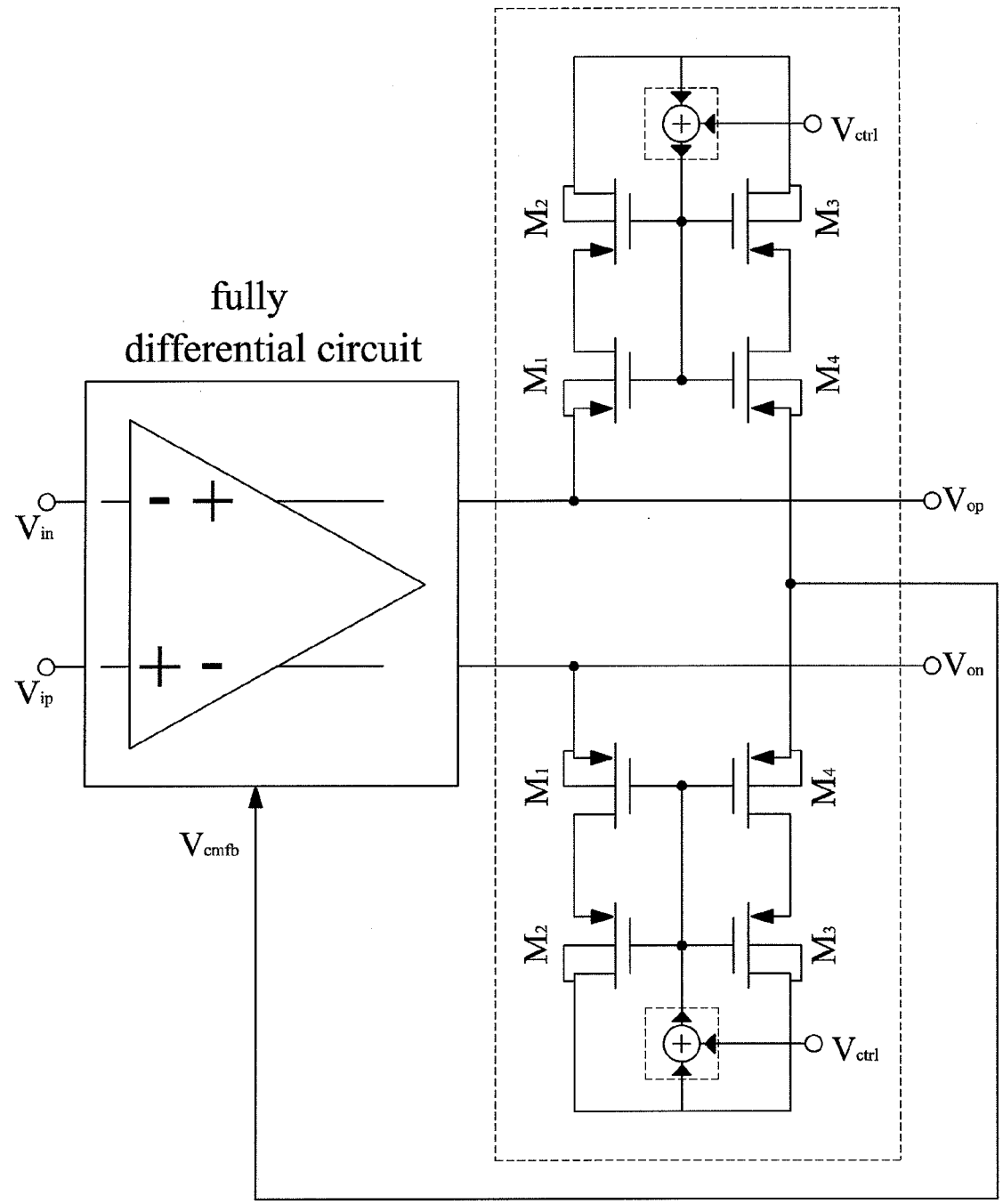
FIG. 7 is a circuit diagram showing applying a tunable voltage-controlled pseudo-resistor structure to a common-mode feedback circuit according to the present invention.

In addition to being used in biomedical amplifier, the tunable voltage-controlled pseudo-resistor structure of the present invention can be used in ordinary analog circuit, such as common-mode feedback circuit, analog filter. Refer to FIG. 7 for a circuit diagram showing applying a tunable voltage-controlled pseudo-resistor structure to a common-mode feedback circuit according to the present invention. As shown in FIG. 7, the tunable voltage-controlled pseudo-resistor structure 1 of FIG. 1 is able to provide fairly high resistance, to replace the existing common-mode feedback circuit, hereby reducing overall power consumption, and suitable to used in a low frequency, biomedical, or audio circuit.

Figure 8:
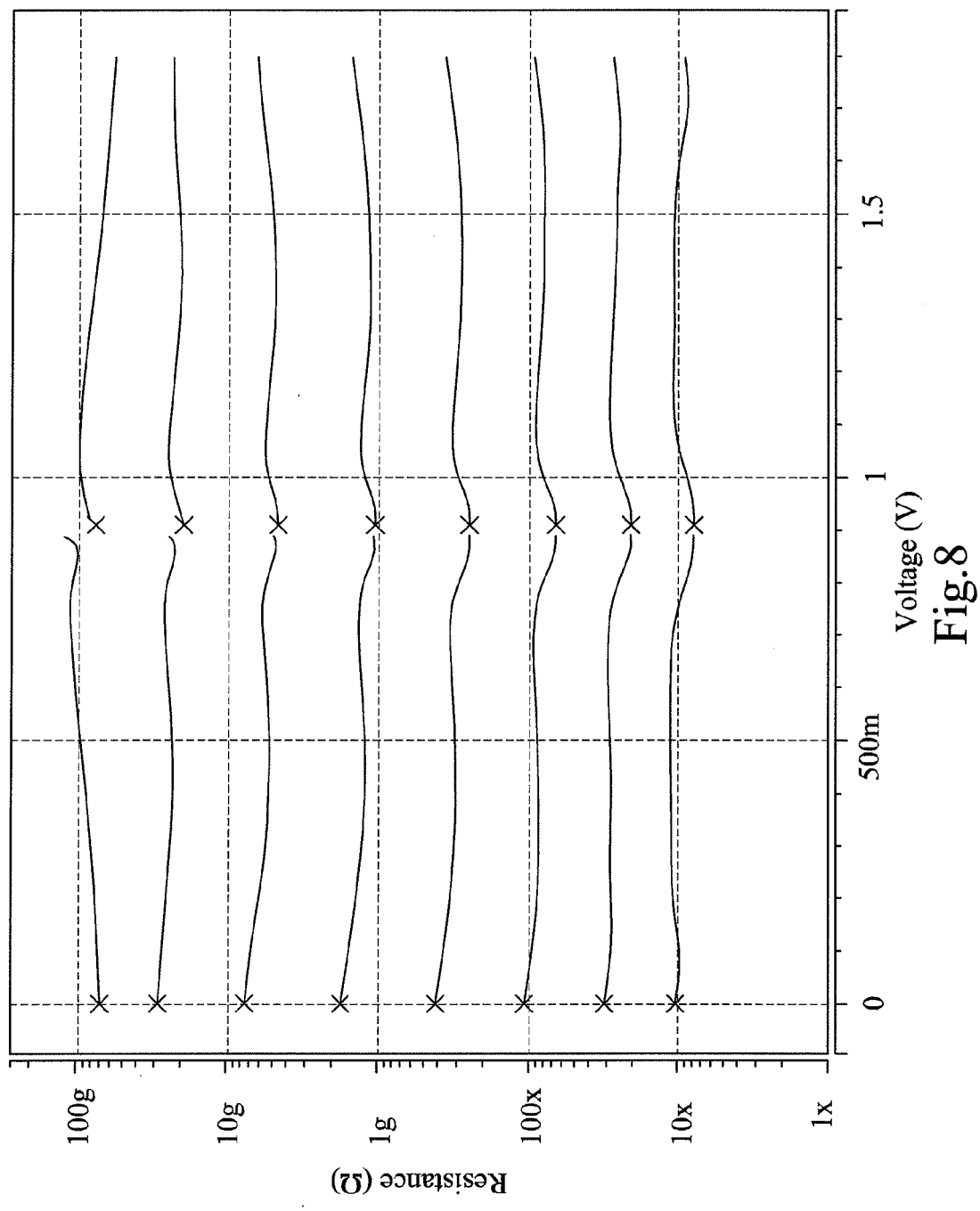
FIG. 8 is a diagram showing the relations of resistance vs voltage of the present invention.

Finally, refer to FIG. 8 for a diagram showing the relations of resistance vs voltage of a tunable voltage-controlled pseudo-resistor of the present invention. As shown in FIG. 8, the resistance is adjustable under different control voltages, so that when the voltage difference is getting large, it can still maintain a constant resistance.

Summing up the above, the present invention provides a tunable voltage-controlled pseudo-resistor structure having symmetric voltage-resistance characteristic, so that it can maintain constant resistance under large input voltage, so it can be used in applications requiring very low cut-off frequency. In general, a common-mode feedback circuit requires wider bandwidth than the original analog circuit, such that large resistance will lead to overly long RC delay, so it is not suitable to use in high speed circuit. On the contrary, low frequency circuit requires fairly large RC circuit (in general, ordinary off-the-shelf devices or additional circuits are used to produce low cut-off frequency), for this reason, the tunable voltage-controlled pseudo-resistor structure of the present invention is very suitable to use in low frequency applications.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A tunable voltage-controlled pseudo-resistor structure, comprising: a symmetric PMOS transistor circuit and an auto-tuning circuit connected in series, an input of said auto-tuning circuit is connected to a central position $V_f$ of said PMOS transistor circuit having a output $V_g$, with purpose of keeping $V_g - V_f$ at a constant value, and in cooperation with an external control terminal ($V_{ctrl}$) to change a value of $V_g - V_f$, said PMOS transistor circuit produces body effect through various different bulk voltages, through said auto-tuning circuit, $V_g$ and $V_f$ are kept constant to make currents of transistors to produce compensation effect, such that regardless of $V_a > V_b$ or $V_a < V_b$, a large resistance is maintained.

2. The tunable voltage-controlled pseudo-resistor structure as claimed in claim 1, wherein said auto-tuning circuit is composed of an amplifier, and four sets of active type resistors and capacitors, connected in parallel.

3. The tunable voltage-controlled pseudo-resistor structure as claimed in claim 1, wherein said tunable voltage-controlled pseudo-resistor structure is used in a biomedical amplifier.

4. The tunable voltage-controlled pseudo-resistor structure as claimed in claim 1, wherein said tunable voltage-controlled pseudo-resistor structure is used in an ordinary analog circuit.

5. The tunable voltage-controlled pseudo-resistor structure as claimed in claim 4, wherein said analog circuit is a common-mode feedback circuit.

6. The tunable voltage-controlled pseudo-resistor structure as claimed in claim 4, wherein said analog circuit is an analog filter.

* * * * *